US008513036B2

(12) United States Patent
Kwon et al.

(10) Patent No.: US 8,513,036 B2
(45) Date of Patent: Aug. 20, 2013

(54) PHOTONIC QUANTUM RING LASER AND FABRICATION METHOD THEREOF

(75) Inventors: O Dae Kwon, Kyungsangbuk-do (KR); Mi-Hyang Shin, Kyungsangbuk-do (KR); Seung Eun Lee, Kyungsangbuk-do (KR); Young-Heub Jang, Kyungsangbuk-do (KR); Young Chun Kim, Kyungsangbuk-do (KR); Junho Yoon, Kyungsangbuk-do (KR)

(73) Assignee: Postech Academy-Industry Foundation (KR)

( * ) Notice: Subject to any disclaimer, the term of this patent is extended or adjusted under 35 U.S.C. 154(b) by 0 days.

(21) Appl. No.: 13/524,256

(22) Filed: Jun. 15, 2012

(65) Prior Publication Data

US 2012/0252146 A1 Oct. 4, 2012

Related U.S. Application Data (62) Division of application No. 12/743,025, filed as application No. PCT/KR2008/006121 on Oct. 16, 2008, now abandoned.

(30) Foreign Application Priority Data

Jan. 21, 2008 (KR) .................. 10-2008-0006300
Apr. 10, 2008 (KR) .................. 10-2008-0032967

(51) Int. Cl.
*H01L 21/00* (2006.01)
(52) U.S. Cl.
USPC .............. 438/29; 438/22; 372/45.01; 257/79; 257/E33.069; 257/E33.025; 257/E33.008; 257/E33.068

(58) Field of Classification Search
USPC ................. 438/22, 28, 29; 257/13, 79, 98, 257/E33.069, E33.025, E33.008, E33.068; 372/45.01, 50.11
See application file for complete search history.

(56) References Cited

U.S. PATENT DOCUMENTS

| 5,416,583 | A | 5/1995 | Sanzari |
| 6,519,271 | B2 | 2/2003 | Kwon et al. |
| 6,803,852 | B2 | 10/2004 | Kwon et al. |

(Continued)

FOREIGN PATENT DOCUMENTS

| JP | 2004289183 | 10/2004 |
| KR | 1020070119019 | 12/2007 |

OTHER PUBLICATIONS

O'Dae Kwon, "2D Whispering Gallery vs. 3D Whispering Cave," Paper #6872-23, LASE 2008-Laser Resonators and Bean Control X, Photonics West 2008, Jan. 21-23, 2008, San Jose, CA, USA.

(Continued)

*Primary Examiner* — David Vu
(74) *Attorney, Agent, or Firm* — Bacon & Thomas, PLLC (57) ABSTRACT

A photonic quantum ring (PQR) laser includes an active layer having a multi-quantum-well (MQW) structure and etched lateral face. The active layer is formed to be sandwiched between p-GaN and n-GaN layers epitaxially grown on a reflector disposed over a support substrate. A coating layer is formed over an outside of the lateral faces of the active layer, and upper electrode is electrically connected to an upper portion of the n-GaN layer, and a distributed Bragg reflector (DBR) is formed over the n-GaN layer and the upper electrode. Accordingly, the PQR laser is capable of oscillating a power-saving vertically dominant 3D multi-mode laser suitable for a low power display device, prevent the light speckle phenomenon, and generate focus-adjusted 3D soft light.

9 Claims, 5 Drawing Sheets

(56) References Cited

U.S. PATENT DOCUMENTS

| | | | |
|---|---|---|---|
| 7,279,347 B2 * | 10/2007 | Hon et al. | 438/29 |
| 2006/0255347 A1 | 11/2006 | DenBaarsn et al. | |
| 2007/0041419 A1 | 2/2007 | Tan et al. | |
| 2007/0081569 A1 | 4/2007 | Kwon et al. | |
| 2009/0135873 A1 | 5/2009 | Matsushita et al. | |

OTHER PUBLICATIONS

O'Dae Kwon, et al. "Mega-pixel PQR laser chips for interconnect, display ITS, and biocell-tweezers OEIC," Paper #6897-29, OPTO 2008-Optoelectronics Integrated Circuits X, Photonics West 2008, Jan. 21-23, San Jose, CA, USA.

* cited by examiner

PHOTONIC QUANTUM RING LASER AND FABRICATION METHOD THEREOF

This application is a Divisional of co-pending application Ser. No. 12/743,025 filed on May 14, 2010, the entire disclosure of which is herein incorporated by reference.

TECHNICAL FIELD

The present invention relates in general to a semiconductor laser, and more particularly, to a GaN-based photonic quantum ring laser suitable for oscillating a multi-mode laser used in a low power display device, and its fabrication method.

BACKGROUND ART

As well-known in the art, light emitting diodes (LEDs) are the focus of attention in the display field because of their outstanding features such as anti-vibration, high reliability, low power consumption, and so on.

Such LEDs have been used in a broad range of industrial applications of diverse fields, e.g., backlight sources of mobile displays, signposts on highways, airport signs, stock quotation boards, subway guide boards, light emitters installed in vehicles and the like, and also recently applied to traffic signal lamps to reduce energy consumption.

In particular, GaN-based LEDs can easily produce white light by applying yellow phosphor powder to cause the combination of yellow and blue light, the complementary colors. However, they are structurally limited to enhance light extraction efficiency in that laser beams are generated only by spontaneous emission rather than stimulated emission.

Therefore, studies have been made about a resonant cavity LED (RCLED), which is configured by adding a resonator to an LED to improve the straightness and intensity of light, or to reduce the full-width half maximum (FWHM) to several nanometers such that power consumption can be reduced without impairing the brightness. More improved resonant cavities of vertical cavity surface emitting laser (VCSEL) were also attempted for vertical lasing via stimulated emission.

However, the RCLED and the VCSEL have a drawback in that they require a high voltage or much current compared with their outputs, resulting in a great heat loss to occur. In order to remedy the LED problem, there were attempts of using a roughly patterned substrate (PS) LED or developing an LED with a roughened surface (RS), but neither of them could actually solve the high voltage problem.

To resolve the deficiency in the existing RCLED and VCSEL, many researches are actively in process to develop a 3D VCSEL type photonic quantum ring (PQR) laser operating with lower power consumption. The PQR laser, unlike the VCSEL laser, does not require a high current and is highly resistant to heat, whereby photo-conversion and thermal characteristics are remarkably improved, compared with any other LEDs.

DISCLOSURE OF INVENTION

Technical Problem

It is, therefore, a primary object of the present invention to provide a photonic quantum ring laser (PQR) suitable for a low power display device, by forming a reflector over and underneath a GaN-based multi-quantum-well (MQW) structure to oscillate a power-saving vertically dominant 3D multi-mode laser, and its fabrication method.

Another object of the present invention is to provide a photonic quantum ring laser capable of preventing the light speckle phenomenon and generating focus-adjusted 3D soft light, by forming a reflector over and underneath a GaN-based MQW structure to oscillate a power-saving vertically dominant 3D multi-mode laser, and its fabrication method.

Technical Solution

In accordance with an aspect of the present invention, there is provided a photonic quantum ring (PQR) laser, including:
  an active layer having a multi-quantum-well (MQW) structure and etched lateral face;
  n-GaN and p-GaN layers, which are epitaxially grown, with the active layer sandwiched therebetween;
  a reflector disposed over a support substrate and having the p-GaN layer thereon;
  a coating layer formed over an outside of lateral faces of the active layer;
  an upper electrode electrically connected to an upper portion of the n-GaN layer; and
  a distributed Bragg reflector (DBR) formed over the n-GaN layer and the upper electrode.

In accordance with another aspect of the present invention, there is provided a fabrication method of a photonic quantum ring laser, including the steps of:
  forming, over a sapphire substrate, an n-GaN layer, an active layer, a p-GaN layer, and a reflector in order;
  adhering a support substrate over the reflector and removing the sapphire substrate;
  performing a selective etching to expose a lateral face of the active layer and forming a coating layer over an outside of the lateral faces of the active layer;
  forming, over the coating layer, an upper electrode electrically connected to the n-GaN layer; and
  forming a distributed Bragg reflector (DBR) in a region having the same width as the active layer and the n-GaN layer over the upper electrode and the n-GaN layer.

Advantageous Effects

In accordance with the present invention, the photonic quantum ring laser is fabricated by depositing a DBR and a metal reflector over and underneath a GaN-based active layer so that it can oscillate a power-saving vertically dominant 3D multi-mode laser suitable for a low power display device, prevent the light speckle phenomenon, and generate focus-adjusted 3D soft light.

In addition, the use of such a PQR laser increases a response speed up to the GHz range compared with that of conventional LEDs. This leads to significant improvement in performance such as high frequency modulation and pulse modulation such that the application range of LEDs can be expanded not only to lighting devices but also to cellular phones, next-generation display devices, and so on.

BRIEF DESCRIPTION OF THE DRAWINGS

The above and other objects and features of the present invention will become apparent from the following description of preferred embodiments, given in conjunction with the accompanying drawings, in which.

BEST MODE FOR CARRYING OUT THE INVENTION

As will be discussed below, the technical gist of the present invention is to fabricate a blue photonic quantum ring (PQR) laser by forming, over a sapphire substrate, an n-GaN layer, an active layer, a p-GaN layer, and a reflector in sequence; adhering a support substrate thereover; removing the sapphire substrate; patterning to expose the active layer; forming a passivation layer; coating polyimide on the outside thereof and planarizing the same; and forming an upper electrode and a distributed Bragg reflector (DBR) thereover. Thus, the use of such technical schemes makes it possible to overcome the prior art problems.

Hereinafter, embodiments of the present invention will be described in detail with reference to the accompanying drawings.

Figure 1:
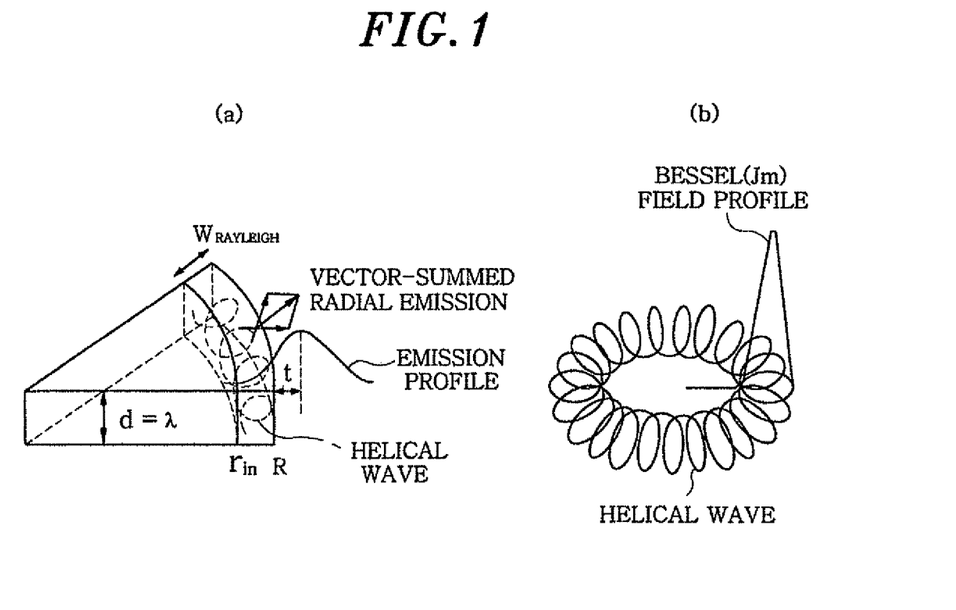
FIG. 1 shows a structural diagram of a 3D toroidal cavity of a photonic quantum ring (PQR) laser in accordance with an embodiment of the present invention.

FIGS. 1A and 1B show the structure of a 3D toroidal cavity of a PQR laser in accordance with an embodiment of the present invention. In particular, FIG. 1A illustrates a perspective view of a portion of the PQR laser and FIG. 1B illustrates a pattern of the helical wave with a Bessel field profile generated in the PRQ laser.

The PQR laser shown in FIG. 1A generally forms a toroidal cavity type whispering gallery (WG) mode under 3D Rayleigh-Fabry-Perot (RFP) conditions by way of vertically confining photons with DBRs arranged over and underneath an active multi-quantum-well (MQW) layer and horizontally confining photons with total reflection occurring around a sidewall including the active MQW layer of the PQR laser. At this time, carriers on the active QW planes of the MQW layer within a ring defined as a torpid are re-distributed in the form of concentric circles of quantum wires (QWRs) by a photonic quantum corral effect (PQCE), such that photons are produced by electron-hole recombination.

Moreover, the oscillation mode wavelength and the intermode spacing (IMS) of the PQR laser can be adjusted by reducing the radius R of the PQR laser. Specifically, by reducing the radius R of the PQR laser, it is also possible to adjust the IMS of the PQR laser that oscillates discretely at multi-wavelengths within an envelope wavelength range for the PQR laser of several nm to several tens of nm. The IMS adjustment in turn makes it possible to determine the number of oscillation modes within the entire envelope of the PQR laser, thereby controlling the amount of power consumption in the PQR laser.

In such a PQR laser, a Rayleigh ring is defined along the circumferential edge of the active MQW layer in the 3D toroidal RFP cavity. The PQR laser is driven at an ultra-low threshold current state while inducing electron-hole recombination of certain QWR concentric circles in the Rayleigh ring. Consequently, the PQR laser oscillating at the ring surpasses the light-emitting performance of self-transition type LEDs in its center, and its output wavelength can be maintained stably by virtue of QWR characteristics.

Figure 2:
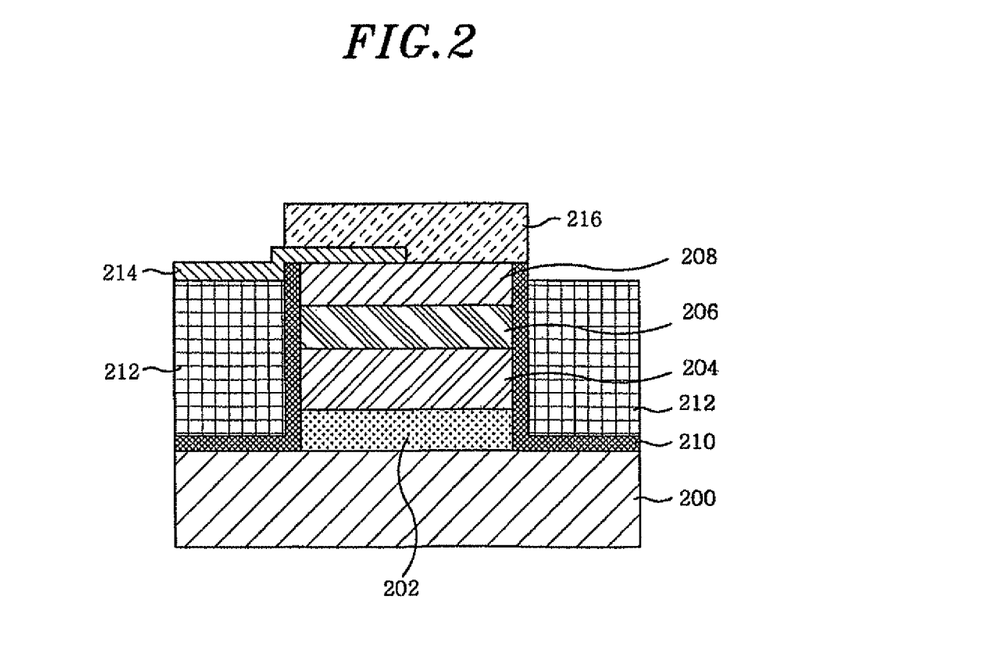
FIG. 2 illustrates a cross-sectional view showing the structure of a blue PQR laser in accordance with an embodiment of the present invention.

FIG. 2 is a cross-sectional view showing the structure of a blue PQR laser in accordance with an embodiment of the present invention.

Referring to FIG. 2, the blue PQR laser includes a semiconductor substrate 200, a reflector 202, a p-GaN layer 204, an active layer 206, an n-GaN layer 208, a passivation layer 210, a coating layer 212, an upper electrode 214, and a DBR 216. The semiconductor substrate 200 serves to support its upper structures formed thereon and may be made of, e.g., silicon (Si) or other metals.

The active layer 206, the n-GaN layer 208, and the DBR 216 are formed in a region of the same width over the semiconductor substrate 200, and the reflector 202 is disposed on the semiconductor substrate 200 and is made of a metal such as silver (Ag) or the like to have reflectivity as high as 90% or more.

Moreover, the active layer 206 is sandwiched between the p-GaN layer 204 and the n-GaN layer 208 which are epitaxially grown, over the reflector 202, using magnesium (Mg) and silicon (Si), respectively. The active layer 206 has an MQW structure, in which a GaN layer as a barrier layer and an InGaN or AlInGaN layer as a well layer are alternately deposited to form, e.g., a four layer laminate. According to this MQW structure, for example, four quantum wells may be formed, and blue, green, and red lights may be generated by adjusting the material composition ratio (e.g., indium (In), aluminum (Al), etc.), followed by selecting a light emitting wavelength range. Needless to say, it is possible to generate white light by coating the blue PQR laser with yttrium aluminum garnet (YAG).

Meanwhile, the reflector 202, the p-GaN layer 204, the active layer 206, and the n-GaN layer 208 are selectively etched in the form of a circular mesa (i.e., etched depending on a specific photoresist pattern) by dry etching, e.g., chemically assisted ion beam etching (CAIBE). In order to protect the circular mesa, the passivation layer 210 made of silicon nitride (e.g., $SiN_x$, etc.) or silicon oxide (e.g., $SiO_2$, etc.) is provided, and polyimide is coated and then planarized over the outside thereof to form the coating layer 212, through which a toroidal type cavity is formed. At this point, the passivation layer 210 has been removed through a planarization process for example, so as to expose an upper surface of the n-GaN layer 208 in contact with the upper electrode 214 and the DBR 216.

After that, the upper electrode 214, which is an n-type ohmic electrode made of Ti/Al for example, is formed in contact with the N-GaN layer 208, and then the DBR 216 is disposed thereover. Specifically, the DBR 216 is formed by alternately laminating layers of a dielectric material such as $TiO_2/SiO_2$, $SiN_x/SiO_2$, or the like, at least one or more time so that it has reflectivity as high as 60% or more. Of course, the DBR 216 may be formed in a $GaN/Al_xGa_{1-x}N$ structure.

Figure 3:
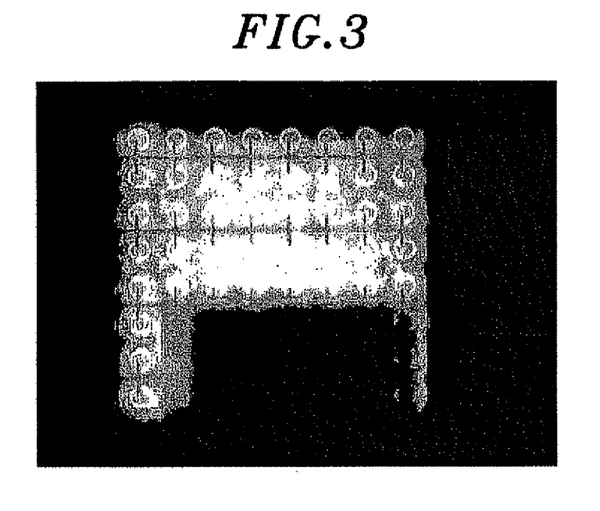
FIG. 3 graphically shows a luminous state of a blue PQR laser in accordance with the present invention.

As an example, FIG. 3 graphically depicts a luminous state of a blue PQR laser in accordance with the present invention. In particular, FIG. 3 provides the photograph of a CCD image of an array of blue PQR lasers where a PQR laser is about 20 μm in diameter and PQR lasers are spaced apart from one another by about 15 μm. This photograph of the CCD image was acquired by filtering or blocking, by a neutral density filter (NDF), most of the light emission amount that causes the saturation of CCD (pixels) as the current injection increases. As known from the CCD image, the inventors could observe a strongly oscillated state of the PQR laser, and learned that the light speckle phenomenon was prevented by the PQR laser and instead the focus-adjusted 3D soft light was generated. Needless to say, the size and array density of the PQR laser may be varied, if needed.

Now, a fabricating process of the blue PQR laser having the structure as set forth above will be explained in detail with reference to FIGS. 4 to FIG. 11.

FIGS. 4 to FIG. 11 illustrate a fabricating process of a blue PQR laser in accordance with the present invention.

Figure 4:
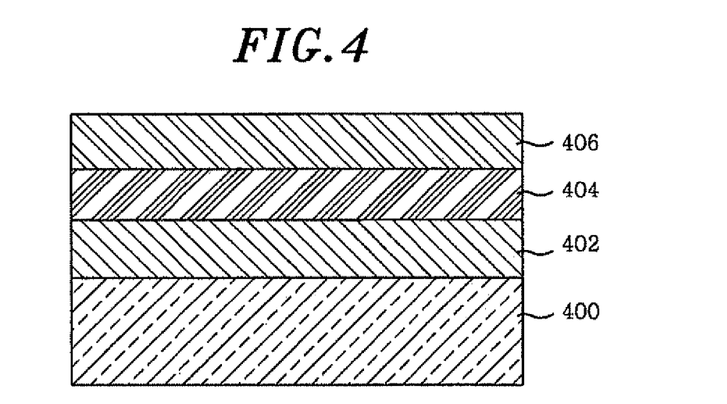
FIGS. 4 to 11 illustrate a fabricating process of a blue PQR laser in accordance with an embodiment of the present invention.

Referring to FIG. 4, an n-GaN layer 402, an active layer 404, and a p-GaN layer 406 are formed sequentially on a sapphire substrate 400. In this structure, the sapphire substrate 400 may be replaced with a substrate made of silicon carbide (SiC), silicon (Si), or GaAs. The n-GaN layer 402 is grown at a temperature in a range of 1000-1200° C., and then doped with silicon as a dopant. For the growth of the n-GaN layer 402, a low-temperature GaN buffer layer may be formed at a relatively low temperature in a range of 500-600° C., thereby preventing the occurrence of crack due to a difference in lattice parameters between the n-GaN layer 402 and the sapphire substrate 400.

The active layer 404 is formed to have an MQW structure in which a well layer and a barrier layer are alternately formed. That is, an InGaN or AlInGaN layer as a well layer and a GaN layer as a barrier layer are alternately deposited to form a four layer laminate for example. According to this MQW structure, for example, four quantum wells may be formed, and one of blue, green, and red light may be generated by adjusting the composition ratio of materials (e.g., indium (In), aluminum (Al), etc.), followed by selecting a light emitting wavelength range. Needless to say, it is possible to generate white light by coating the blue PQR laser with yttrium aluminum garnet (YAG). Thereafter, the p-GaN layer 406 doped with magnesium (Mg) is grown over the active layer 404 under gas atmosphere such as hydrogen (H) or the like.

Figure 5:
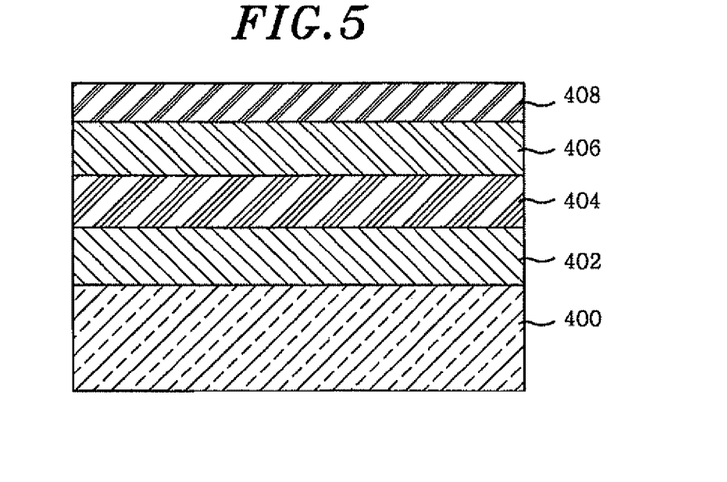

Next, as shown in FIG. 5, a reflector 408 made of silver (Ag) or the like is formed over the sapphire substrate 400 on which the n-GaN layer 402, the active layer 404, and the p-GaN layer 406 are provided in order as mentioned above. In particular, the reflector 408 is prepared in a manner that its reflectivity is more than 90%.

Figure 6:
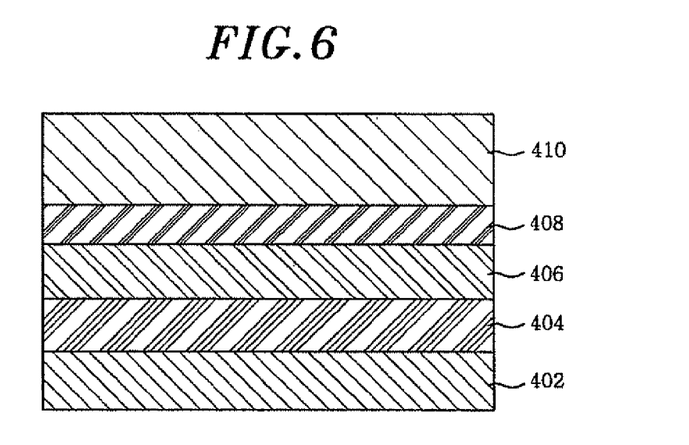

Then, referring to FIG. 6, a semiconductor substrate 410 is adhered over the reflector 408 in order to support the structure as noted above, and the sapphire substrate 400 is then removed by a laser lift-off (LLO) method by using an excimer laser. Next, the surface of the n-GaN layer 402, from which the sapphire substrate 400 is removed, undergoes a cleaning process.

Figure 7:
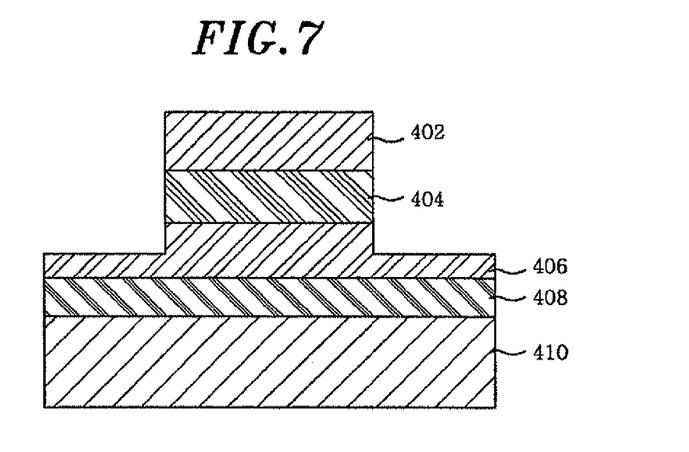

Subsequently, as shown in FIG. 7, the n-GaN layer 402, the active layer 404 and the p-GaN layer 406 are subjected to a selective etching to a certain thickness of the p-GaN layer 406 by dry etching such as CAIBE (that is, etched depending on a specific photoresist pattern), so that a circular mesa with a smooth lateral face is formed. In result of the dry etching, for example, an 8×8 array of the PQR lasers may be arranged in an area of a standard LED of about 300-400 µm in size. While the fabrication method in accordance with the embodiment of the present invention has been described as performing the dry etching down to a certain thickness of the p-GaN layer 406, it may also acceptable to carry out the dry etching down to the p-GaN layer 406 or to the reflector 408 as depicted in FIG. 2, such that the layers from the n-GaN layer 402 to the active layer 404 are fully exposed. In other words, the dry etching is done selectively to completely expose only the lateral face of the active layer 404.

Figure 8:
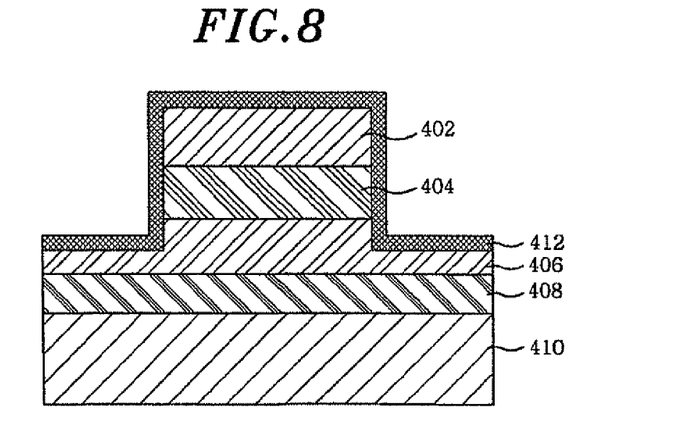
Figure 9:
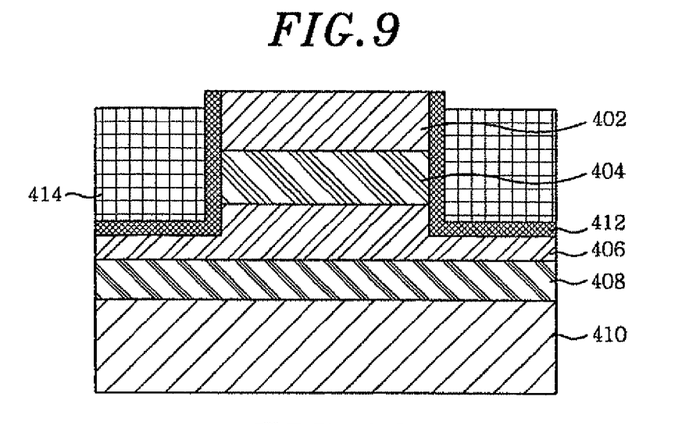

Next, referring to FIG. 8, a passivation layer 412 made of $SiN_x$, $SiO_2$, or the like is deposited on the entire upper surface on which the circular mesa is formed, and is then selectively removed by planarization to expose the upper face of the n-GaN layer 402 in contact with an upper electrode 416 and a DBR 418 to be formed later. Then, polyimide is coated on the passivation layer 412, and undergoes a polyimide (PI) planarization process for exposing the n-GaN layer 402, such that a coating layer 414 is formed in a toroidal cavity structure, as shown in FIG. 9.

Figure 10:
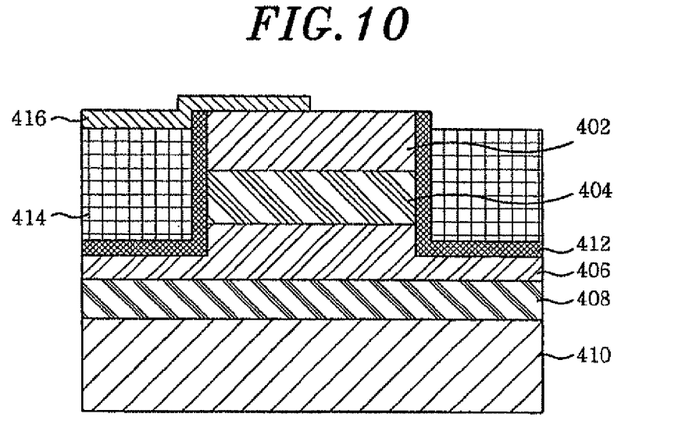

In succession, a metal material such as Ti/Al is deposited on the coating layer 414 and then dry etched to selectively form an upper electrode 416 as an n-type ohmic electrode as shown in FIG. 10, so as to be in contact with the n-GaN layer 402. Alternatively, the upper electrode 416 may be formed through an ohmic contact which is made by etching for the formation of an n-type ohmic electrode and then by heat-treating it under predetermined temperature and time conditions in nitrogen or nitrogen-mixed gas atmosphere.

Figure 11:
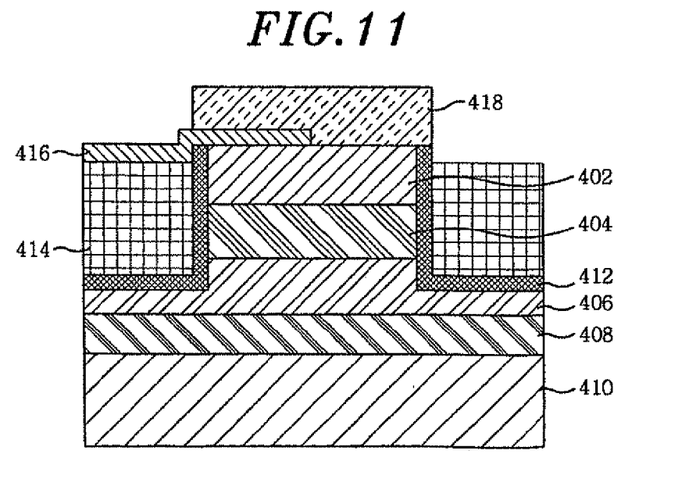

Next, a DBR 418 is formed over the upper electrode 416 by using a dielectric material such as $TiO_2/SiO_2$, $SiN_x/SiO_2$ or the like, and a selective etching is performed such that the DBR 418 has the same width as that of the active layer 404 and the n-GaN layer 402 as shown in FIG. 11, thus completing the fabrication process of the PQR laser. Here, the DBR 418 is obtained by alternately laminating layers of a dielectric material such as $TiO_2/SiO_2$, $SiN_x/SiO_2$ or the like, at least one time so that it has reflectivity as high as 60% or more. As an example, if the DBR 418 has a two-alternate-layer laminate structure, it may be made of $TiO_2/SiO_2/TiO_2/SiO_2$, $SiN_x/SiO_2/SiN_x/SiO_2$, etc. Of course, the DBR 418 may be formed in a $GaN/Al_xGa_{1-x}N$ structure.

To be short, the blue PQR laser can be fabricated by forming, over a sapphire substrate, an n-GaN layer, an active layer, a p-GaN layer, and a reflector in sequence; adhering a support substrate over the reflector; removing the sapphire substrate; performing a selective etching until the active layer is exposed; forming a passivation layer; coating polyimide on the outside thereof and planarizing the polyimide coating; and forming an upper electrode and a distributed Bragg reflector thereover.

Figure 12:
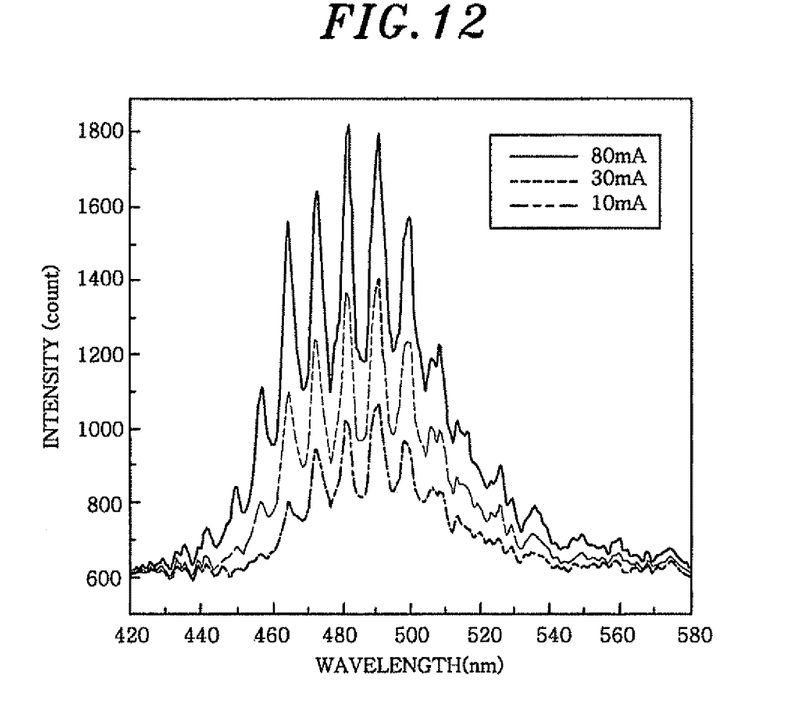
FIG. 12 shows an oscillation spectrum in relation to injection current in an array chip of PQR lasers in accordance with the present invention.

FIG. 12 shows an oscillation spectrum in relation to injection current in an array chip of PQR lasers in accordance with the present invention. Particularly, FIG. 12 shows an oscillation spectrum in different levels of current injected into an 8×8 array chip of the PQR lasers, each having a diameter of about 20 µm. It exhibits the entire envelope of about 40 nm FWHM, which is very similar to the spectrum profile of a typical GaN LED and shows a multi-mode lasing spectrum having a $FWHM_m$ of 3-4 nm oscillating in that range.

Figure 13:
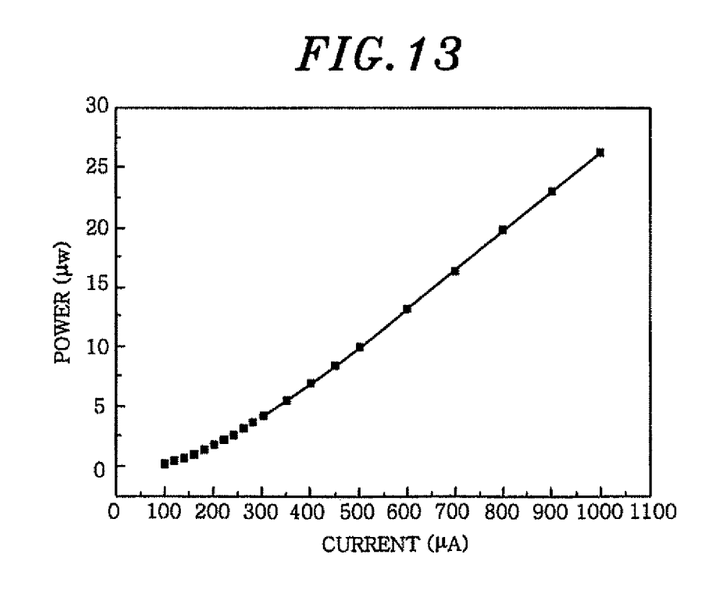
FIG. 13 shows an L-I curve of a PQR laser in accordance with the present invention.

FIG. 13 presents an L-I curve of, e.g., a 2×8 array of PQR lasers in accordance with the present invention, in which a threshold current of the 2×8 array of PQR lasers is approximately 200 µA, with about 13 µA for each PQR laser.

While the invention has been shown and described with respect to the preferred embodiments, it will be understood by those skilled in the art that various changes and modification may be made without departing from the scope of the invention as defined in the following claims.

The invention claimed is:

1. A fabrication method of a photonic quantum ring laser, comprising the steps of:

forming, over a sapphire substrate, an n-GaN layer, an active layer, a p-GaN layer, and a reflector in order;

adhering a support substrate over the reflector and removing the sapphire substrate;

performing a selective etching to expose a lateral face of the active layer and forming a coating layer over an outside of the lateral faces of the active layer;

forming, over the coating layer, an upper electrode electrically connected to the n-GaN layer; and forming a distributed Bragg reflector (DBR) in a region having the same width as the active layer and the n-GaN layer over the upper electrode and the n-GaN layer.

2. The method of claim 1, further comprising the steps of:
Before forming the coating layer, forming a passivation layer on the lateral face of the active layer exposed by the selective etching.

3. The method of claim 1, wherein the passivation layer is formed by using $SiN_x$ of $SiO_2$.

4. The method of claim 1, wherein the reflector is formed by using silver (Ag).

5. The method of claim 1, wherein the DBR is formed by using a dielectric material in a $TiO_2/SiO_2$ or $SiN_x/SiO_2$ structure.

6. The method of claim 4, wherein the DBR is formed in a $GaN/Al_xGa_{1-x}N$ structure.

7. The method of claim 1, wherein the active layer is formed by using InGaN or InAlGaN.

8. The method of claim 1, wherein the sapphire substrate is removed by a laser lift-off (LLO).

9. The method of claim 1, wherein the coating layer is formed by performing polyimide coating and polyimide planarization.

* * * * *